(12) United States Patent
Voigt et al.

(10) Patent No.: US 6,822,281 B2
(45) Date of Patent: Nov. 23, 2004

(54) TRENCH CELL FOR A DRAM CELL ARRAY

(75) Inventors: Peter Voigt, Hallbergmoos (DE);
Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/395,456

(22) Filed: Mar. 24, 2003

(65) Prior Publication Data

US 2003/0178662 A1 Sep. 25, 2003

(30) Foreign Application Priority Data

Mar. 22, 2002 (DE) .......................................... 102 12 932

(51) Int. Cl.[7] ...................... H01L 27/108; H01L 29/76; H01L 29/94; H01L 31/119
(52) U.S. Cl. ...................................... 257/301; 257/302
(58) Field of Search ................................ 257/301–302; 438/243, 386, 242, 484

(56) References Cited

U.S. PATENT DOCUMENTS

| | | | |
|---|---|---|---|
| 5,937,296 A | 8/1999 | Arnold | |
| 6,262,448 B1 | 7/2001 | Enders et al. | |
| 6,441,422 B1 * | 8/2002 | Mandelman et al. | ....... 257/300 |
| 2002/0004290 A1 * | 1/2002 | Gruening et al. | ........... 438/484 |

FOREIGN PATENT DOCUMENTS

EP                0 852 396 A2         7/1998

* cited by examiner

*Primary Examiner*—Cuong Nguyen
(74) *Attorney, Agent, or Firm*—Laurence A. Greenberg; Werner H. Stemer; Gregory L. Mayback

(57) ABSTRACT

A trench cell for use in a DRAM array includes a vertical selection transistor of a first conductivity type at the—seen in the bit line direction—first side of the trench hole, a blocking doping region near the surface, of a second conductivity type, is provided adjacent to the trench hole, the blocking doping region lying opposite the vertical selection transistor. As a result, leakage currents can be avoided and, in addition, the trench cells can be disposed at a shorter distance from one another.

19 Claims, 8 Drawing Sheets

TRENCH CELL FOR A DRAM CELL ARRAY

BACKGROUND OF THE INVENTION

FIELD OF THE INVENTION

The invention relates to a trench cell for storing digital information in a DRAM structure and to a cell array constructed from such trench cells.

DRAM arrays are, typically, realized by a regular configuration of trench cells. For such a purpose, a multiplicity of trench holes is etched into a semiconductor substrate. The lower region of a trench hole, then, serves in each case for accommodating a storage capacitor of the DRAM cell. One or a plurality of selection transistors, embodied as field-effect transistors, is provided per memory cell. The gates of the field-effect transistors can be driven through a word line associated with the cell. Through the source/drain path of the selection transistors, the storage capacitor can be connected to an associated bit line to write digital information to the cell or to read stored values from the cell.

In the course of advancing miniaturization, it becomes more and more important to construct memory cells in a manner that saves as much space as possible. For such a purpose, it is known to integrate the selection transistor or selection transistors of a trench cell into the sidewall of the trench hole. In the case of such vertical selection transistors, the gate electrode of the selection transistor is integrated into the upper part of the trench hole. A thin oxide layer at the sidewall of the trench hole serves as gate oxide. The lower source/drain terminal is formed by a buried doping region, the so-called "buried strap", which is conductively connected to the storage capacitor. A doping region near the surface forms the upper source/drain terminal.

The prior art discloses trench cells for DRAM arrays as a so-called VTC cell concept, in which two vertical selection transistors disposed opposite one another are provided per trench cell. Such a trench cell is shown in FIG. 1. In this cell, the usually weakly p-doped silicon substrate is contact-connected in the necessary manner from the lower substrate region, to be precise, usually from outside the cell array. Because the doping density of the substrate must not be too high, only a contact-connection with relatively low conductivity can be implemented. Furthermore, the problem occurs that the substrate region above the $n^+$-doped buried doping regions can be pinched off from the lower substrate region by the relatively greatly extended space charge zones of the doping regions. This, then, has the effect that the substrate potential for the vertical selection transistors floats freely and erroneous switching states of the transistors arise on account of these fluctuations. In the case of the trench cell shown in FIG. 1, such a pinch-off problem has only been able to be combated hitherto by the cells not being disposed too closely in their spacing from one another. More extensive miniaturization is prevented as a result.

FIG. 2 shows a further trench cell type referred to as a hybrid cell concept. In such a hybrid cell, only one vertical selection transistor is provided per trench cell. In this cell type, too, the substrate is contact-connected from the lower substrate region. The problem with this cell type is that a parasitic transistor can form on the side of the cell opposite to the selection transistor, which has the effect that disturbing leakage currents occur. To prevent these leakage currents from becoming too large, it has always been necessary hitherto to ensure that the cells are not disposed too close together. More extensive miniaturization is prevented as a result.

SUMMARY OF THE INVENTION

It is accordingly an object of the invention to provide a trench cell for a DRAM cell array that overcomes the hereinafore-mentioned disadvantages of the heretofore-known devices of this general type and that provides a trench cell that enables a densely packed configuration of the trench cells without the process of reading in and out being impaired by leakage currents, and at the same time, enables the semiconductor substrate to be reliably contact-connected.

With the foregoing and other objects in view, there is provided, in accordance with the invention, a trench cell for storing digital information, including a semiconductor substrate of a first conductivity type, the semiconductor substrate defining a trench hole having a lower region, a surface, and an upper region with a sidewall section, a storage capacitor being formed in the semiconductor substrate in the lower region of the trench hole, the storage capacitor having an inner electrode, a dielectric intermediate layer, and an outer electrode, a vertical selection transistor being formed in the semiconductor substrate in the upper region of the trench hole at the sidewall section, the vertical selection transistor having an upper source/drain doping region and a lower source/drain doping region of a second conductivity type, a gate electrode, an insulator layer, and a channel region being disposed between the upper source/drain doping region and the lower source/drain doping region, the channel region being isolated from the gate electrode by the insulator layer, a bit line running in a direction perpendicular to the trench hole, the bit line being connected to the upper source/drain doping region, a word line running perpendicular to the trench hole and transverse with respect to the bit line, the word line being connected to the gate electrode, the lower source/drain doping region being connected to one of the inner and outer electrodes, and a doping region of the first conductivity type being adjacent the surface, the doping region being disposed in the semiconductor substrate opposite the vertical selection transistor viewed in the direction of the bit line adjacent to the sidewall section of the trench hole. In other words, the doping region is disposed adjacent the sidewall section of the trench hole in the semiconductor substrate opposite the vertical selection transistor viewed in the direction of the bit line.

With the objects of the invention in view, there is also provided a cell array, including a multiplicity of regularly disposed trench cells according to the invention.

The invention's trench cell for storing digital information in a DRAM structure has a vertical selection transistor disposed on the—seen in a bit line direction—first side of the trench hole provided for the trench cell. The upper source/drain terminal of the vertical selection transistor is formed by a doping region situated beside the trench hole and the lower source/drain terminal of the vertical selection transistor is formed by a buried doping region. Both doping regions have a doping of a first conductivity type. The trench cell has a doping region near the surface, of a second conductivity type, on the—seen in the bit line direction—second side adjacent to the trench hole.

The aforesaid leakage current that has been able to cause considerable disturbance to the read-in and read-out behavior of the vertical selection transistors can be, effectively, suppressed by the invention's doping region near the surface, of the opposite conductivity type to the source/drain doping. This additional blocking doping region is disposed adjacent to a trench sidewall oxide of the cell considered and prevents a parasitic transistor from being able to form at the rear wall of the cell considered. A conductive channel cannot then form between the blocking doping region and the buried source/drain doping region of the selection transistor of the adjacent cell. Independently of the charge of the gate electrode associated with the transistor considered, this prevents a leakage current from being able to form.

In accordance with another feature of the invention, it is advantageous if the blocking doping region extends as far as the substrate surface and is highly doped. This is because the doping implantation can be performed from the substrate surface in such a case. It is furthermore advantageous here if, above the blocking doping region, an interconnect is disposed on the substrate surface, through which the semiconductor substrate can be contact-connected. Through the blocking doping region that extends as far as the silicon surface, the weakly doped substrate of the same conductivity type can be contact-connected through the interconnect. A good contact with the substrate can be produced in this way.

In accordance with a further feature of the invention, the contact with the substrate is produced from the semiconductor surface through an interconnect. Because the conductivity of an interconnect is very much higher than that of the weakly doped substrate, the substrate can be contact-connected significantly better in this way. The substrate potential in the region of the selection transistor can no longer be pinched off even by a widened space charge zone of the buried source/drain doping region ("buried strap") of the selection transistor. As a result, it is always ensured that the substrate potential in the region of the selection transistor has a defined value. Erroneous switching states of the selection transistor can, thus, be prevented. Because consideration is no longer given to the pinch-off effect in the case of the solution according to the invention, the trench cells can be disposed at a shorter distance from one another than hitherto. In this respect, the solution according to the invention makes it possible to increase the storage density.

It is advantageous, moreover, if an insulating layer is disposed above the interconnect and insulates the interconnect from bit lines situated thereabove. The bit line situated thereabove is connected to the highly doped region that functions as upper source/drain terminal of the selection transistor. To insulate the interconnect running above the blocking doping region from the bit line situated thereabove, an oxide layer is disposed between the interconnect and the bit line. The oxide layer must have a thickness such that the distance from the bit line is large enough to keep the contribution to the bit line capacitance as small as possible.

In accordance with an additional feature of the invention, it is advantageous if the interconnect includes polysilicon, tungsten, tungsten silicide, or titanium. First, the materials mentioned have a good conductivity. What is more, the materials are also sufficiently heat-resistant so that the interconnect does not vaporize under the action of heat during subsequent process steps.

In accordance with an added feature of the invention, the first conductivity type is a p-type doping and the second conductivity type is an n-type doping. It is, furthermore, advantageous if the semiconductor substrate and the blocking doping are p-doped because n-channel transistors can, then, be used as selection transistors, n-channel transistors usually having better properties than p-channel transistors. A weakly p-doped well is usually provided in the semiconductor substrate for accommodating the cell array.

In accordance with yet another feature of the invention, the doping concentration of the substrate varies in a manner dependent on the distance from the substrate surface, the doping concentration being minimal at the depth at which the buried source/drain doping region of the selection transistor is situated. The buried source/drain doping region forms, together with the surrounding oppositely doped substrate, a pn junction operated in the reverse direction. The leakage currents of a pn junction increase as the doping density of the substrate increases. To minimize the leakage currents, it is, therefore, advantageous if the doping concentration of the substrate is varied in a manner dependent on the distance from the surface such that it assumes its minimum at the pn junction.

The cell array according to the invention includes a multiplicity of regularly disposed trench cells. When using the trench cells according to the invention, they can be disposed at a short distance from one another so that a high integration density becomes possible.

In accordance with yet a further feature of the invention, the word line is a plurality of word lines, the bit line is a plurality of bit lines, the bit lines and the word lines run orthogonally to one another, and the trench cells are disposed in a rhomboidal configuration at every second crossover point.

It is advantageous, here, if the trench holes are disposed in accordance with a rhomboidal scheme. If a specific bit line is considered, then active word lines and passing word lines alternate along the bit line. The trench cells are in each case situated at the crossover points of the bit line and the active word lines. The active word lines of the bit line considered are, at the same time, the passing word lines of the adjacent bit line. Conversely, the passing word lines of the bit line considered are, at the same time, the active word lines of the adjacent bit line. In the case of the adjacent bit line, too, the trench cells are in each case disposed at the crossover points of the bit line and the active word lines. As such, a rhomboidal scheme is produced for the configuration of the trench holes and makes it possible to accommodate a large number of trench cells per unit area. The word lines and bit lines run orthogonally to one another in the case of this scheme. The invention's interconnects for contact-connecting the substrate can be integrated into this known rhomboidal scheme. Thus, the scheme does not have to be modified to realize the solution according to the invention.

In accordance with yet an added feature of the invention, the doping region is disposed in the direction of the bit line in a region between the word line associated with a respective one of the trench cells and an adjacent word line running parallel thereto.

In accordance with yet an additional feature of the invention, the word lines have insulating encapsulation, an interconnect is connected to the doping region, and the interconnect is adjacent the surface and is disposed between the insulating encapsulation of a respective one of the word lines associated with a given trench cell and the insulating encapsulation of an adjacent one of the word lines running parallel thereto.

In accordance with again another feature of the invention, an interconnect is connected to the doping region and the interconnect is adjacent the surface and is to be contact-connected from outside the cell array. It is advantageous if the substrate can be contact-connected from outside the cell array through the interconnects. As such, it is not necessary to alter the structure of the word lines and bit lines running orthogonally to one another in the region of the cell array.

Due to the low resistance of the interconnect, a good contact with the substrate can be produced even through a contact-connection of the substrate from outside the cell array.

The fabrication of the trench cells according to the invention proceeds from a pre-patterned semiconductor substrate that already has trench holes with vertical selection transistors each disposed on a—seen in a bit line direction— first side of the trench hole. The blocking doping is introduced into each trench hole on the second side opposite the first side seen in the bit line direction.

In such case, the procedure set forth in the following text is preferred when introducing the blocking doping.

Firstly, a doping with doping material of the second conductivity type is introduced in planar fashion onto the semiconductor substrate, between trench holes that are adjacent in the bit line direction. Afterward, the word lines and also the associated insulating encapsulations are patterned, and a doping with doping material of the first conductivity type is, then, introduced in each case into the region between the active word line associated with a trench cell and the passing word line that is adjacent toward the second side of the trench cell, the word lines with their associated insulating encapsulations being used as a mask and the doping being overcompensated with doping atoms of the first conductivity type in the process.

In such a procedure, the first doping may be introduced in planar fashion. In the region in which the second, opposite doping is introduced, the concentration of the second doping material is chosen to be so high that the first doping is overcompensated in the region. As a result, a mask step is necessary only for the introduction of the second doping, while the first doping is introduced in each case without a mask.

During the introduction of the second doping material, the patterned word lines with their insulating encapsulations are in each case used as a mask. Although a mask is necessary for introducing the second doping material, in order to cover parts of the substrate surface, the actual delimitation of the doping regions is prescribed by the insulating encapsulations of the word lines. Due to this effect, referred to as self-alignment, the requirements made of the alignment accuracy and of the production accuracy of the mask can be lowered.

Other features that are considered as characteristic for the invention are set forth in the appended claims.

Although the invention is illustrated and described herein as embodied in a trench cell for a DRAM cell array, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
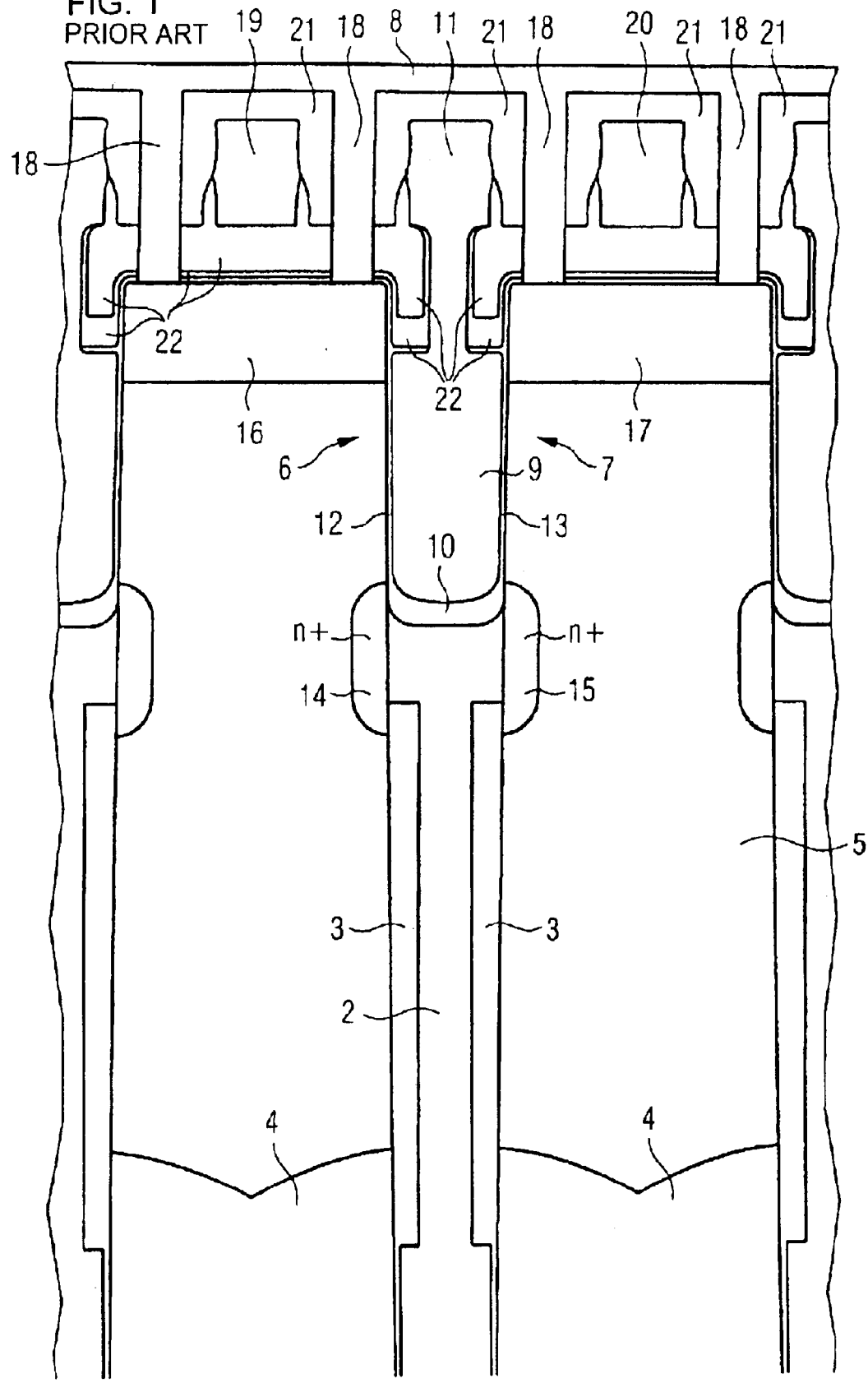
FIG. 1 is a longitudinal cross-sectional view through a prior art array of trench cells with two vertical selection transistors per trench cell.

Referring now to the figures of the drawings in detail and first, particularly to FIG. 1 thereof, there is shown a longitudinal section along a bit line of an array of trench cells in accordance with the prior art. The inner electrode 2 including polysilicon or another conductive material is situated in the lower region of the trench hole 1, the inner electrode 2, together with a trench sidewall oxide 3, which serves as dielectric, and an $n^+$-doped counterelectrode 4 forming the storage capacitor of the trench cell. The $n^+$-doped region 4 forming the counterelectrode is also referred to as "buried plate". The inner electrode 2 is insulated from the $n^+$-doped counterelectrode 4 and a weakly p-doped substrate 5 by the trench sidewall oxide 3. To store digital information, electrical charge can be stored in the storage capacitor and be read out again.

The inner electrode 2 can be connected to an associated bit line 8 through two vertical selection transistors 6, 7. To keep down the power consumption of the DRAM array, the selection transistors are embodied as field-effect transistors. A polysilicon gate 9 represents the common gate electrode for the two selection transistors 6, 7. The polysilicon gate 9 is insulated from the inner electrode 2 by a trench top oxide 10. The polysilicon gate 9 is conductively connected to an active word line 11. The transistors 6, 7 are in the on or off state depending on which potential is present on the active word line 11. If the active word line 11 is at positive potential, a conductive n-channel forms below a gate oxide 12 and connects a buried $n^+$-type doping region 14 ("buried strap")—connected to the cell node—to an $n^+$-doped region 16 near the surface of the first transistor 6. The buried $n^+$-type doping region 14, thus, serves as lower source/drain terminal, while the $n^+$-doped region 16 near the surface represents the upper source/drain terminal. A conductive n-channel also forms below a gate oxide 13 and connects a buried $n^+$-type doping region 15 to an $n^+$-doped region 17 near the surface of the second transistor 7.

If the polysilicon gate 9 has a positive potential, the vertical selection transistors 6, 7 are in the on state, and the inner electrode 2 of the storage capacitor is connected to a bit line 8 through the source/drain paths of these two transistors 6, 7 and also through four bit line contacts 18. Through the bit line 8, digital information can, then, be written to the storage capacitor or read from the storage capacitor.

Both the active word line 11 and passing word lines 19, 20 are insulated from the bit line contacts 18 and from the bit line 8 by insulating encapsulations 21 and by insulating regions 22.

Figure 2:
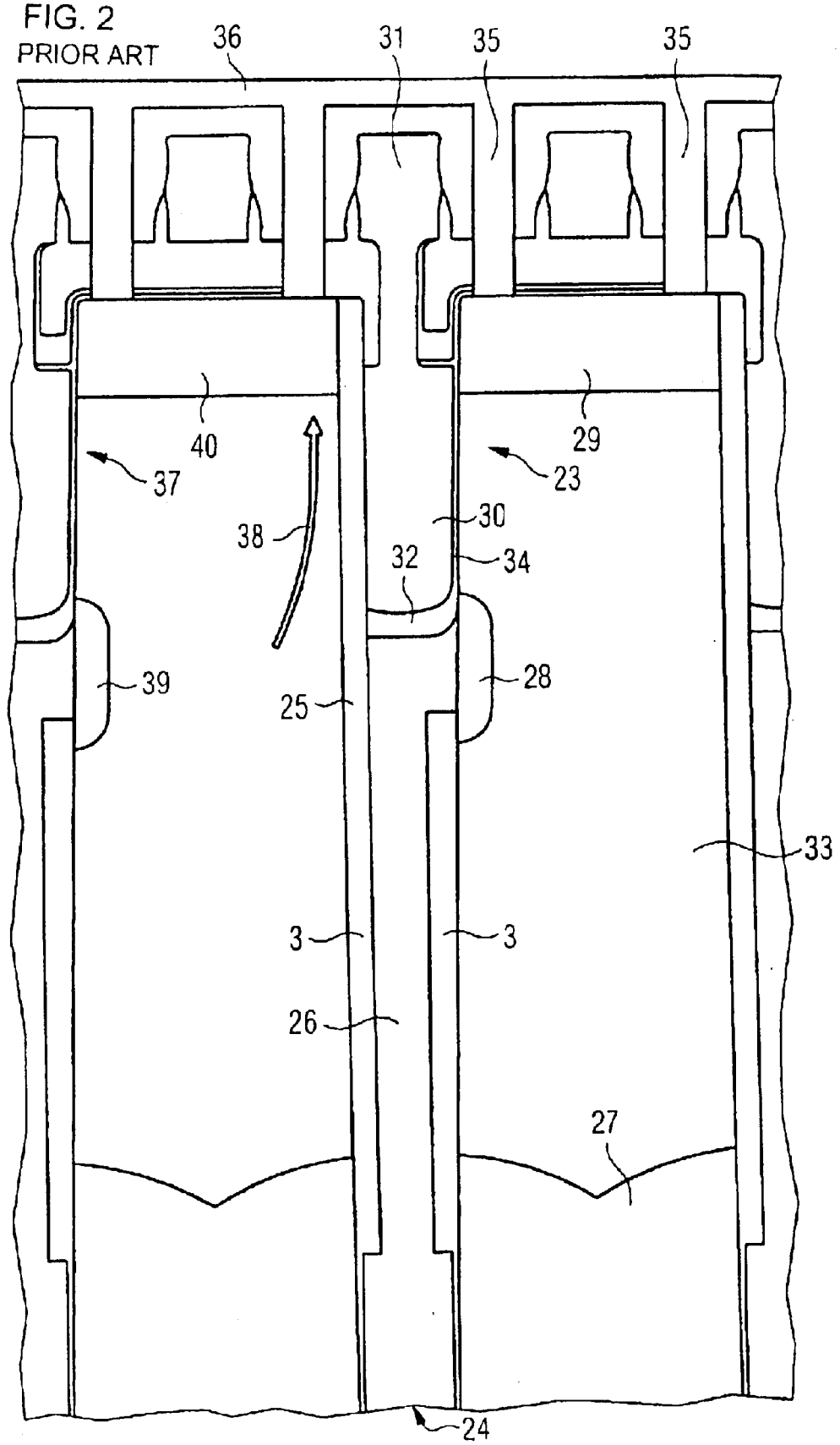
FIG. 2 is a longitudinal cross-sectional view through a prior art array of trench cells with one vertical selection transistor per trench cell.

FIG. 2 illustrates a longitudinal section through another prior art cell array, which is constructed from trench cells having only one vertical selection transistor per cell. This vertical selection transistor 23 is disposed on the—seen in the bit line direction—first side of a trench hole 24. On the second side of the trench hole 24 opposite the first side seen in the bit line direction, a trench sidewall oxide 25, which insulates an inner electrode 26 from an $n^+$-type counterelectrode 27 of a storage capacitor, is extended as far as the substrate surface.

The vertical selection transistor 23 includes a lower source/drain terminal realized as a buried $n^+$-type doping region 28, and also an upper source/drain terminal in the form of an $n^+$-type doping region 29 near the surface. The vertical selection transistor 23 is switched through a polysilicon gate 30, which is conductively connected to an active word line 31. The polysilicon gate 30 is insulated from the cell node by a trench top oxide 32. The polysilicon gate 30 is insulated from a weakly p-doped substrate 33 by a gate oxide 34.

If the potential of the polysilicon gate 30 is at positive potential, then the source-drain path between the buried $n^+$-type doping region 28 and the $n^+$-type doping region 29 near the surface becomes conductive, and the inner electrode 26 is connected to a bit line 36 through the source/drain path and two line contacts 35.

However, the trench cell shown in FIG. 2 has the disadvantage that a parasitic transistor can form on the second side of the trench hole 24, that is to say, on the "rear side" of the vertical selection transistor 23. The consequence of this is that even when a vertical selection transistor 37 of the adjacent cell is in the off state, a leakage current 38 can flow from a buried $n^-$-type doping region 39 to an $n^+$-type doping region 40 near the surface of the second selection transistor 37. In such a case, the polysilicon gate 30 and the extended trench sidewall oxide 25 of the first selection transistor 23 act as gate electrode and gate oxide, respectively, of the parasitic transistor.

Figure 3:
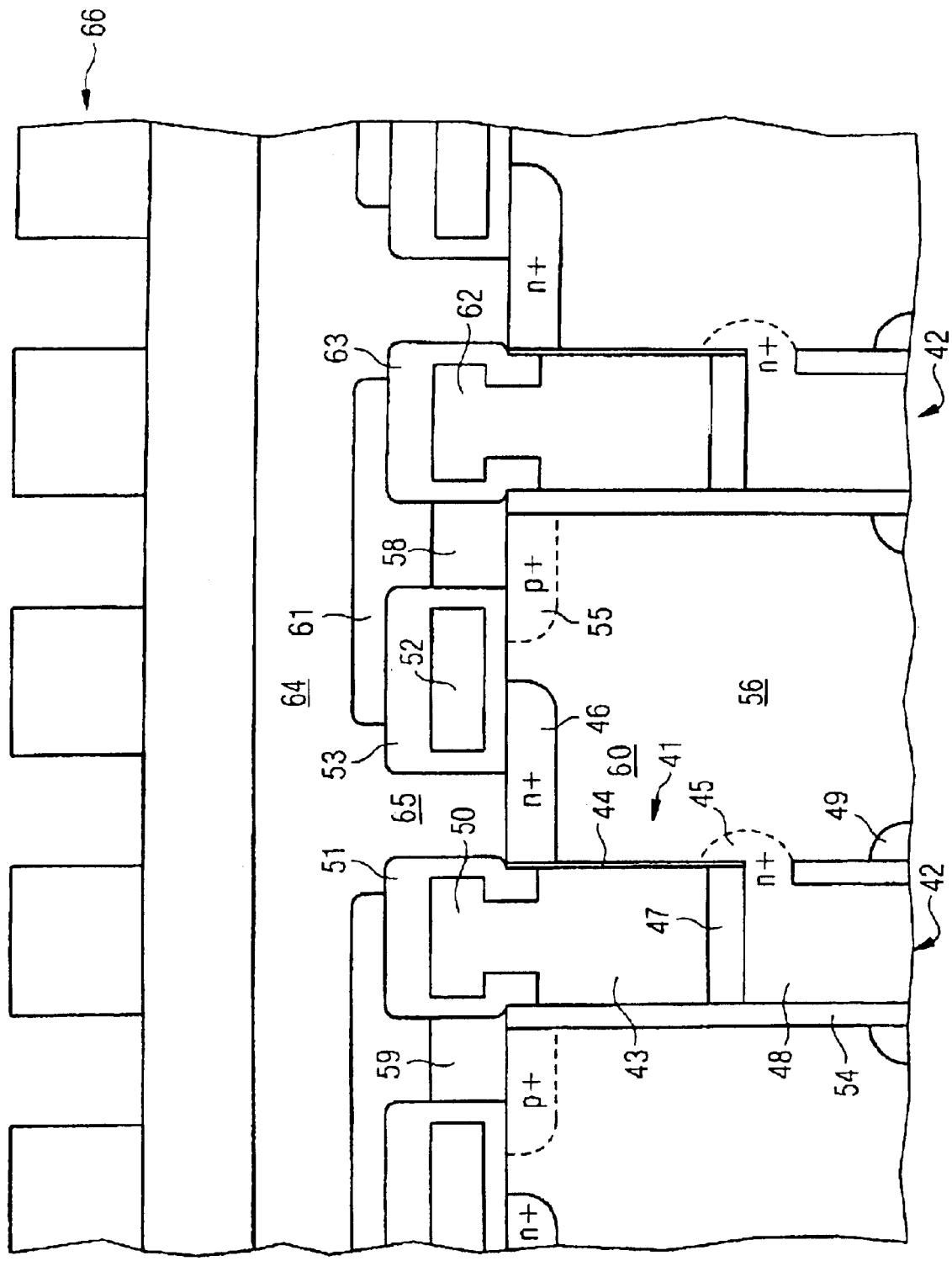
FIG. 3 is a longitudinal cross-sectional view through an array of trench cells according to the invention along section line 80 in FIG. 5, each of the trench cells having one vertical selection transistor per trench cell.

The formation of such a parasitic transistor can be prevented in the case of the solution according to the invention as shown in FIG. 3. FIG. 3 shows a longitudinal section along a bit line through a cell array constructed from trench cells according to the invention. One vertical selection transistor is provided per trench cell.

The selection transistor is in each case disposed at a first sidewall section 41 of a trench hole 42 and includes a polysilicon gate 43, a gate oxide 44, a buried $n^+$-type doping region 45, which serves as lower source/drain terminal, and also an $n^+$-type doping region 46 near the surface, which serves as upper source/drain terminal. In such a case, the selection transistor is constructed such that the buried $n^+$-type doping region 45 is spaced apart from the $n^+$-type doping region 46 near the surface by an intervening channel region 60, which is, in turn, isolated from the polysilicon gate 43 in the trench hole by the gate oxide 44. The polysilicon gate 43 is insulated from an inner electrode 48 in the trench hole 42 by a trench top oxide 47. The inner electrode 48, together with a trench sidewall oxide 54 as dielectric and an $n^+$-doped counterelectrode 49, forms a storage capacitor, the inner electrode 48 being connected to the buried $n^+$-type doping region 45 of the selection transistor.

In contrast to the prior art solution shown in FIG. 2, in the case of the trench cell according to the invention, the $n^+$-type doping region 46 near the surface does not extend as far as the adjacent trench hole, but, rather, only in the region between an active word line 50 with its insulating encapsulation 51 and a passing word line 52 with its insulating encapsulation 53. In such a case, the active word line 50 is disposed above the trench hole 42 and is connected to the polysilicon gate 43 of the selection transistor. In the case of the solution according to the invention, a $p^+$-doped region 55 near the surface is situated in the region between the passing word line 52 and the trench sidewall oxide 54, which is in each case extended as far as the substrate surface on the side remote from the selection transistor. As a result, in the case of the solution according to the invention, a parasitic transistor is prevented from forming on the rear side of the vertical selection transistor. Undesirable leakage currents can be prevented by the $p^+$-type doping region 55.

Moreover, the $p^+$-type doping region 55 according to the invention serves for contact-connecting a, likewise, p-doped substrate 56. For such a purpose, an interconnect 58 is applied above the $p^+$-doped region 55, between the insulating encapsulation 53 of the passing word line 52 and the insulating encapsulation 51 of the active word line 57, by which interconnect 58 the p-doped substrate 56 can be contact-connected through the $p^+$-doped region 55. The substrate 56 can be reliably contact-connected from above by the interconnects 58, 59, etc. running in the word line direction. For such a purpose, the interconnects 58, 59, etc. are, preferably, routed out from the cell array.

An oxide layer 61 extending from the insulating encapsulation 53 of the passing word line 52 as far as the insulating encapsulation 63 of the active word line 62 is applied above the interconnect 58. The oxide layer 61 insulates the interconnect 58 from a bit line 64 connected to the doping region 46 near the surface of the selection transistor. The interconnects 58, 59, etc. must be sufficiently thick so that the bulk resistance remains sufficiently low. The distance between the respective interconnect and the bit line 64 must be high enough to keep the contribution to the bit line capacitance as small as possible. The bit line 64 runs above an oxide layer 61 and is connected to the $n^+$-type doping region 46 of the selection transistor inter alia through a bit line contact 65. A metallization plane 66 is situated above the bit lines.

Figure 4:
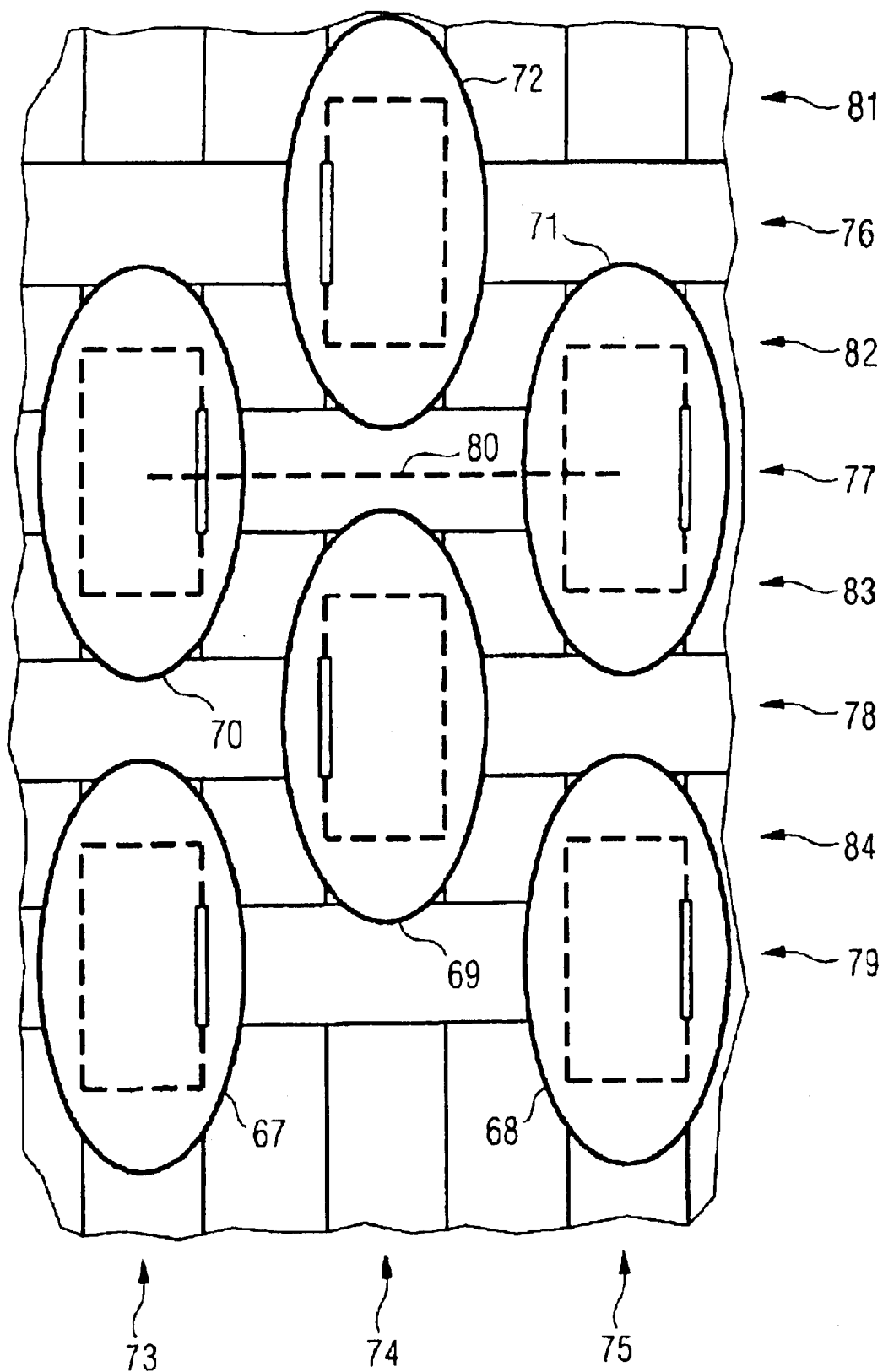
FIG. 4 is a plan view of an array of trench cells according to the invention.

FIG. 4 shows an illustration of a cell array constructed from trench cells 67 to 72 according to the invention in plan view. The buried $n^+$-type doping region is depicted as an emboldened line for each trench cell. The trench cells 67, 70 are contact-connected by a word line 73, the trench cells 69, 72 are contact-connected by a word line 74, and the trench cells 68, 71 are contact-connected by a word line 75. The trench cell 72 is contact-connected by a bit line 76, the trench cells 70, 71 are contact-connected by a bit line 77, the trench cell 69 is contact-connected by a bit line 78, and the trench cells 67, 68 are contact-connected by a bit line 79. The longitudinal section illustrated in FIG. 3 relates to the section line 80 depicted in FIG. 4. With regard to the section line 80, the word lines 73, 75 are active word lines, while the word line 74 is a passing word line. The configuration of the mutually orthogonal word and bit lines defines the rhomboidal pattern of the trench cells that is characteristic of the cell array.

Shallow trench isolations 81, 82, 83, 84 are, respectively, disposed between the bit lines 76, 77, 78, 79. The shallow trench isolations 81, 82, 83, 84 are etched trenches filled with insulating material, preferably, with oxide, which are etched into the substrate down to a depth that goes beyond the depth of the buried $n^+$-doped oxide regions. The catchment areas of the various bit lines are isolated from one another with the aid of the shallow trench isolations.

FIGS. 5A to 5D illustrate the different process steps used during the fabrication of the structure according to the invention. In the case of the prepatterned semiconductor substrate shown in FIG. 5A, firstly a $p^+$-type implantation 87 was introduced in planar fashion in the region between trench holes 85, 86. Word lines 88, 89, 90 and associated insulating encapsulations 91, 92, 93 are, subsequently, patterned. Next, an $n^+$-type doping region near the surface, which is intended to serve as upper source/drain terminal of a vertical selection transistor 94, has to be patterned. For such a purpose, a photomask 95 is applied to the semiconductor structure, the photomask 95 having, in the region between the word lines 88, 89, an opening 96 through which the n-type doping can be introduced. Because the opening 96 is larger than the opening 97 formed by the insulating encapsulations 91, 92, the opening 97 formed by the insulating encapsulations represents the actual mask for the n$^+$-type implantation. This has the advantage that the photomask 95 has to be aligned less precisely. The term used here is self-alignment of the structure. Through the openings 96, 97, n$^+$-type doping material is introduced into the semiconductor substrate, to be precise such that the p$^+$-type doping density is overcompensated by the n$^+$-type doping density introduced so that the region 98 is ultimately n$^+$-doped.

Figure 5A:
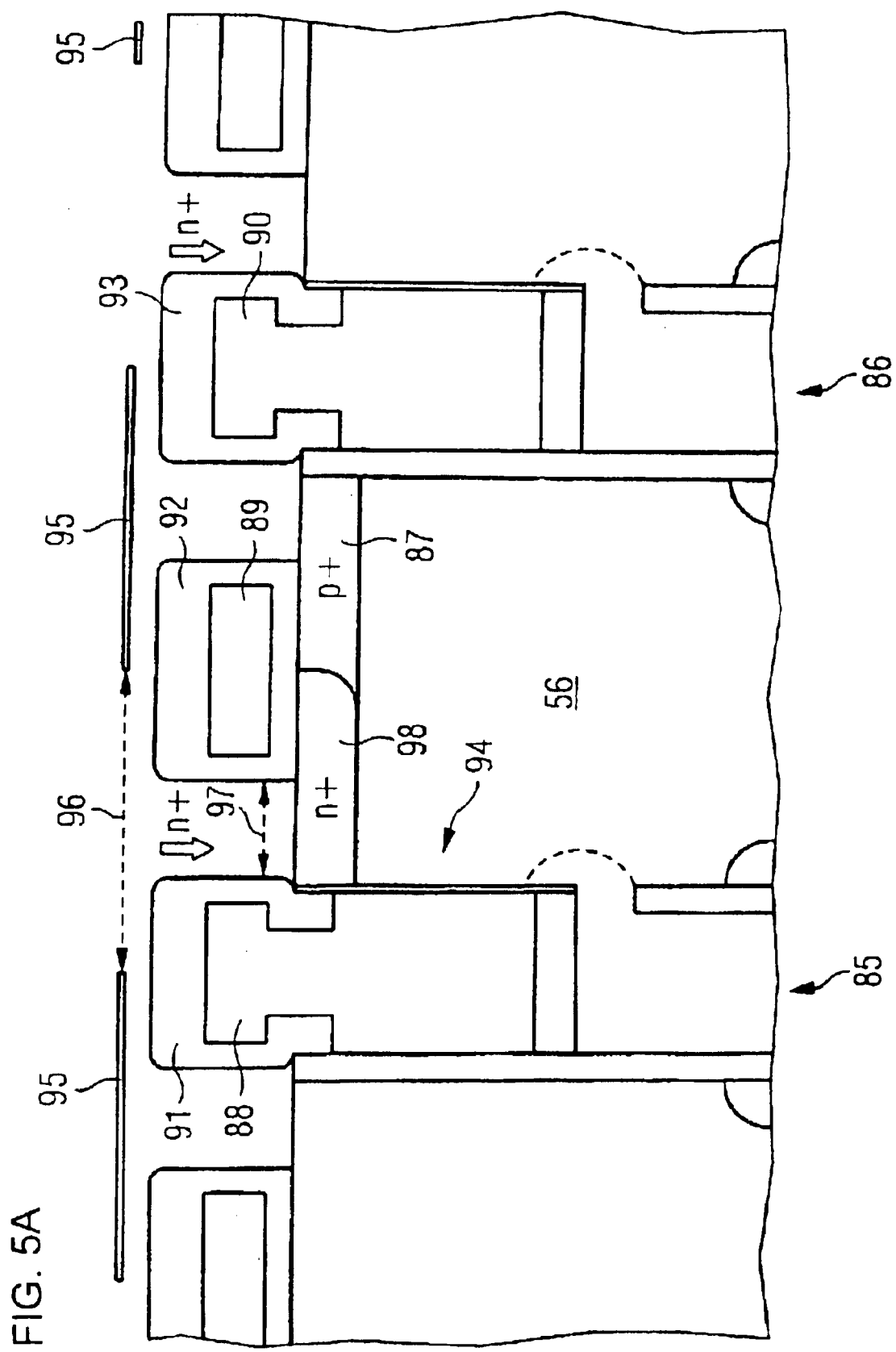
FIGS. 5A to 5D are longitudinal cross-sectional views through an array of trench cells according to the invention illustrating a sequence of process steps for fabricating the array.
Figure 5B:
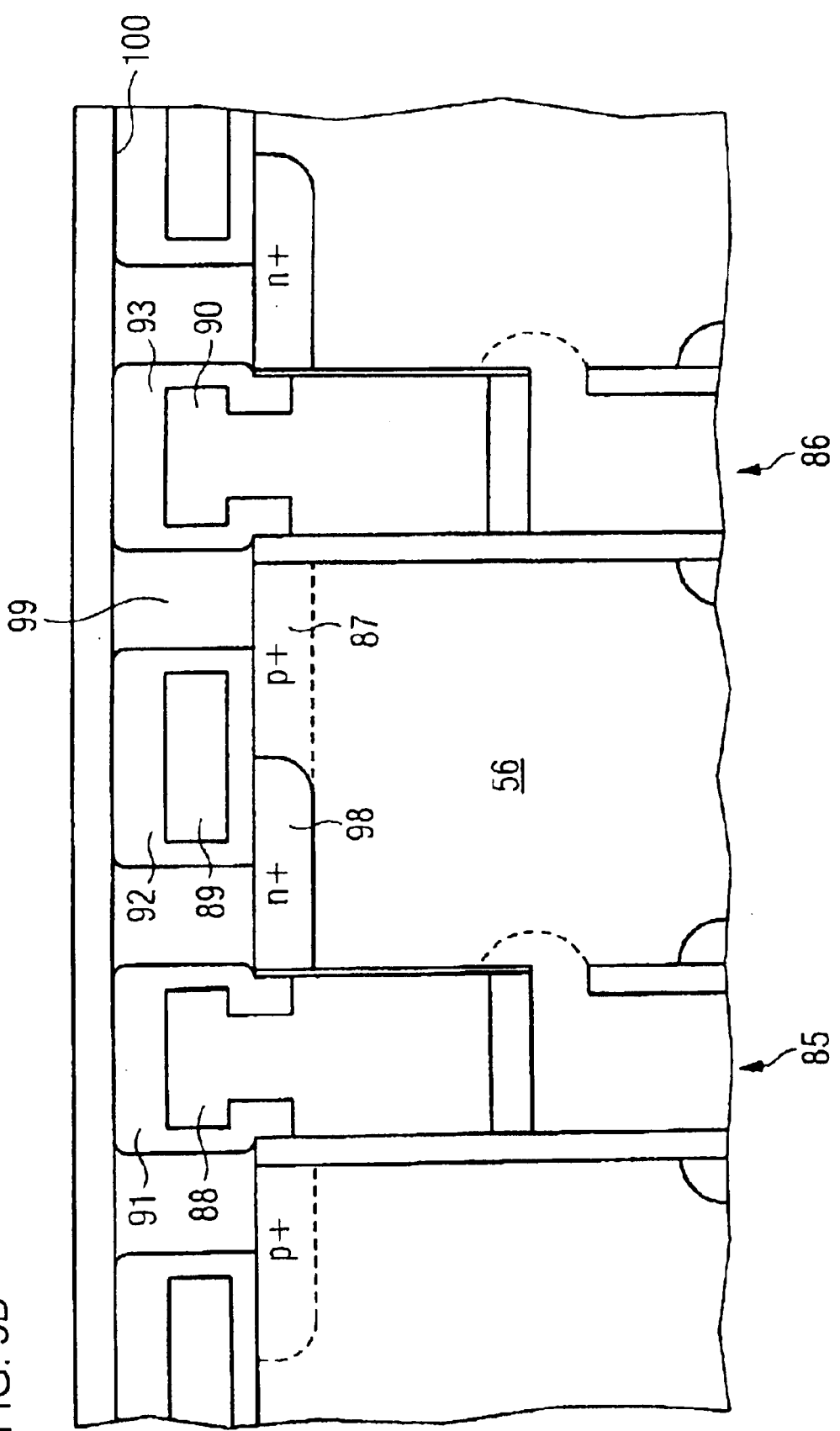

In the subsequent process step, shown in FIG. 5B, a conductive layer 99 is deposited on the prepatterned semiconductor surface. The conductive layer 99 may include tungsten, tungsten silicide, titanium, or polysilicon. Once the conductive layer 99 has been applied in planar fashion, the surface is planarized, to be precise, planed with insulating encapsulations 91, 92, 93, etc. This can be carried out with high accuracy by Chemical Mechanical Polishing (CMP).

Figure 5C:
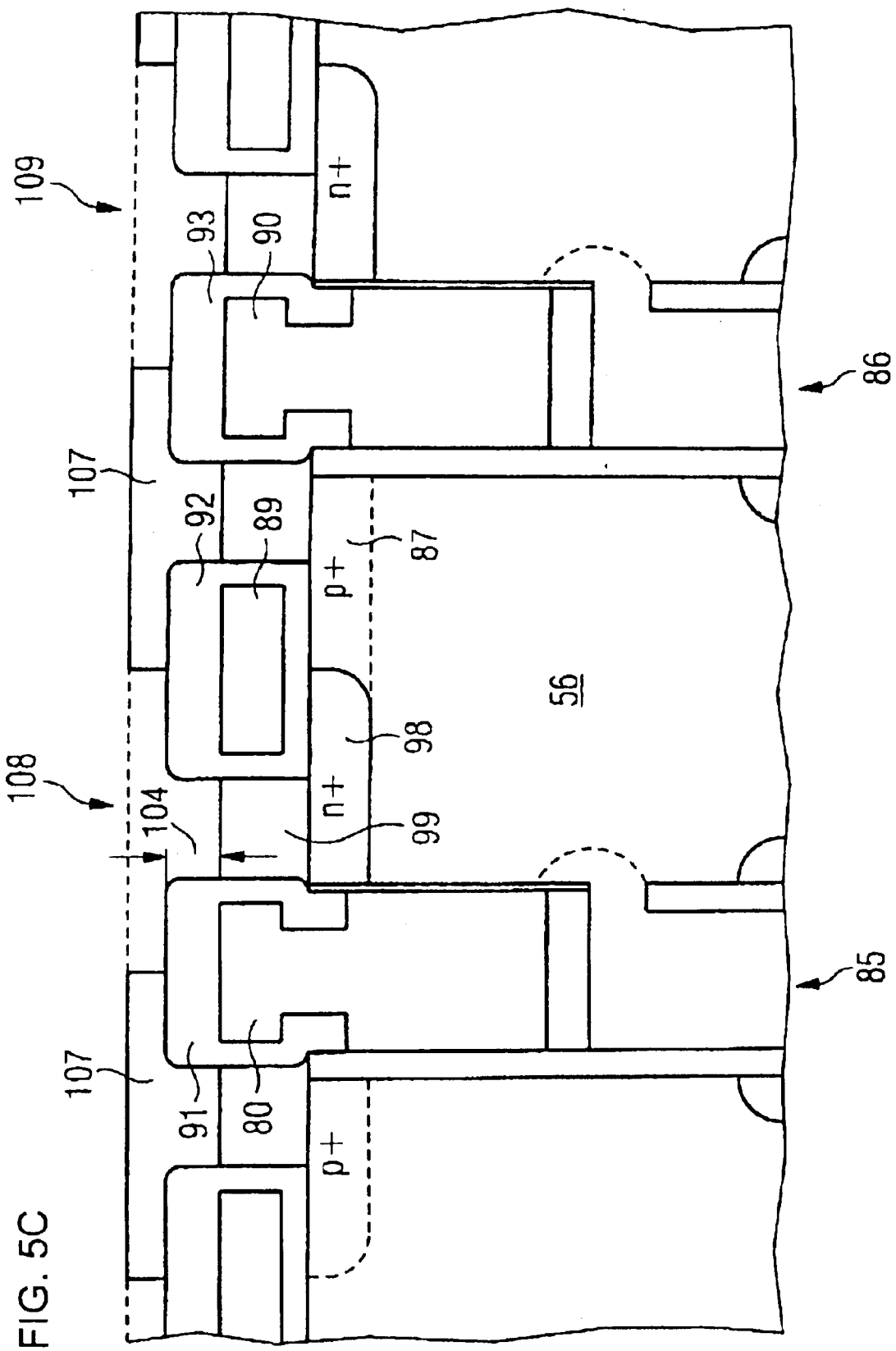

FIG. 5C shows how, during the subsequent process step, the conductive layer 99 is etched back by a distance 104 by a selective etching process. For such a purpose, an etching process is used that attacks only the conductive layer 99, but not insulating encapsulations 91, 92, 93, etc. A wet-chemical etching step, in particular, is suitable for such an etching process.

In the next step, an insulating oxide layer 107 is applied to the semiconductor substrate in planar fashion. The applied oxide layer 107 is, then, etched, with the aid of a photomask, at the locations 108, 109, etc. at which the bit line contacts are intended to be situated.

Figure 5D:
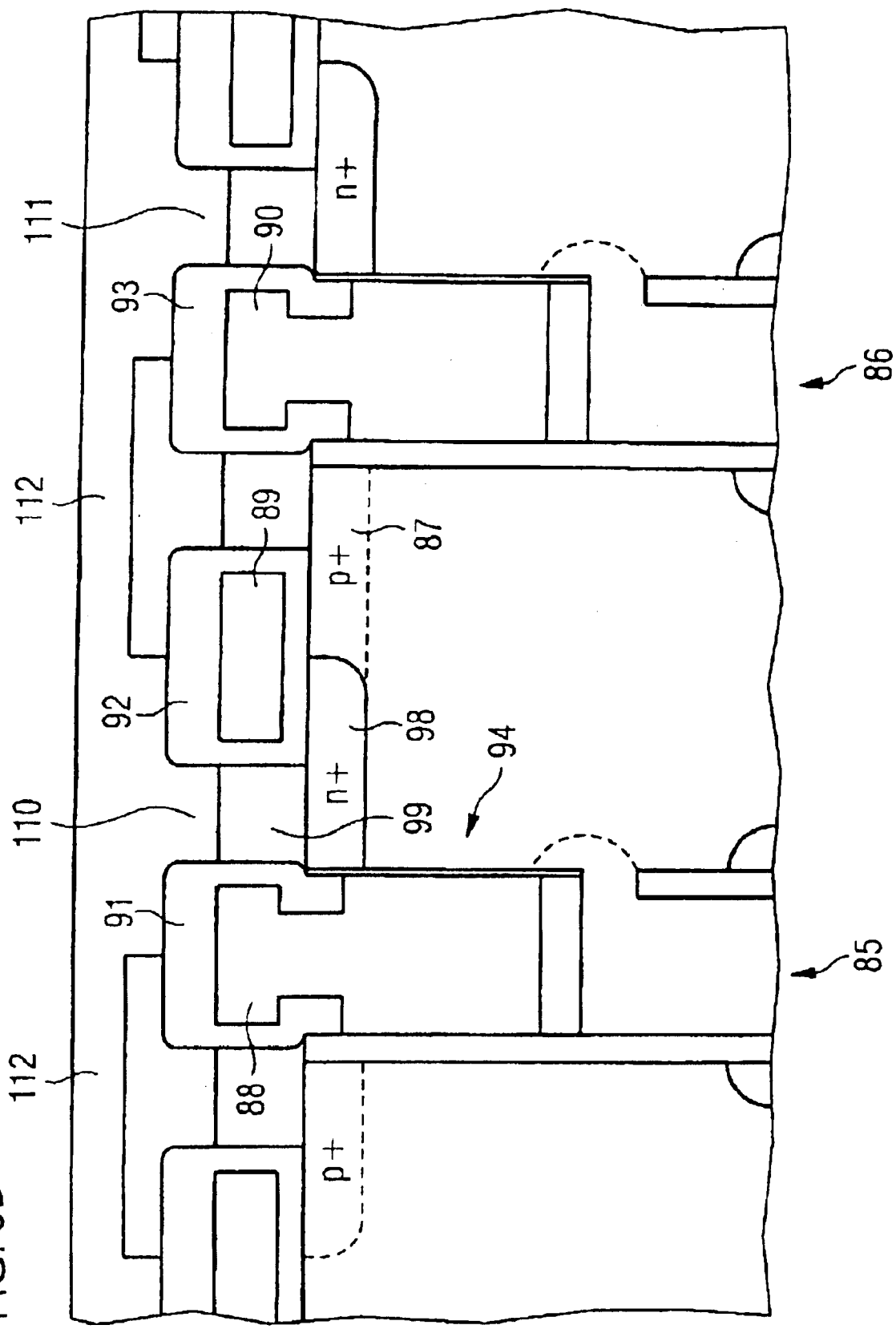

FIG. 5D shows how conductive material is applied to the semiconductor substrate to obtain bit line contacts 110, 111, etc. and also a bit line 112. Further metallization planes may, then, be applied to the trench cell structure according to the invention that has, thus, been obtained.

It lies within the scope of the invention, over and above the abovementioned exemplary embodiments, to modify the specified dimensions, concentrations, materials, and processes in a suitable way to fabricate the trench cell according to the invention. In particular, it is possible here to have recourse to all known process sequences for forming trench cells in the context of DRAM fabrication processes. Furthermore, it is possible to embody the conductivity type of the doped regions in the trench cell in complementary fashion. Moreover, the specified materials for forming the various layers may be replaced by other materials known in this connection.

The features of the invention that are disclosed in the above description, the drawings and the claims may be of importance both individually and in any desired combination for the realization of the invention in its various configurations.

We claim:

1. A trench cell for storing digital information, comprising:
    a semiconductor substrate of a first conductivity type, said semiconductor substrate defining a trench hole having:
        a lower region;
        a surface; and
        an upper region with a sidewall section;
    a storage capacitor being formed in said semiconductor substrate in said lower region of said trench hole, said storage capacitor having an inner electrode, a dielectric intermediate layer, and an outer electrode;
    a vertical selection transistor being formed in said semiconductor substrate in said upper region of said trench hole at said sidewall section, said vertical selection transistor having:
        an upper source/drain doping region and a lower source/drain doping region of a second conductivity type;
        a gate electrode;
        an insulator layer; and
        a channel region being disposed between said upper source/drain doping region and said lower source/drain doping region, said channel region being isolated from said gate electrode by said insulator layer;
    a bit line running in a direction perpendicular to said trench hole, said bit line being connected to said upper source/drain doping region;
    a word line running perpendicular to said trench hole and transverse with respect to said bit line, said word line being connected to said gate electrode;
    said lower source/drain doping region being connected to one of said inner and outer electrodes; and
    a doping region of said first conductivity type being adjacent said surface, said doping region being disposed in said semiconductor substrate opposite said vertical selection transistor viewed in said direction of said bit line adjacent to said sidewall section of the trench hole.

2. The trench cell according to claim 1, wherein said doping region is highly doped and extends as far as said surface of said semiconductor substrate.

3. The trench cell according to claim 2, further comprising an interconnect connected to said doping region.

4. The trench cell according to claim 3, wherein said semiconductor substrate has a doping concentration varying dependent upon a distance from said surface, said doping concentration being minimal at a depth at which said lower source/drain doping region of said selection transistor is disposed.

5. The trench cell according to claim 3, further comprising an insulating layer disposed above said interconnect, said bit line being disposed above said insulating layer, said insulating layer insulating said interconnect from said bit line.

6. The trench cell according to claim 3, wherein said interconnect is of polysilicon, tungsten, tungsten silicide, or titanium.

7. The trench cell according to claim 1, wherein said first conductivity type is a p-type doping and said second conductivity type is an n-type doping.

8. A cell array, comprising:
    a multiplicity of regularly disposed trench cells according to claim 1.

9. The cell array according to claim 8, wherein:
    said word line is a plurality of word lines;
    said bit line is a plurality of bit lines;
    said bit lines and said word lines run orthogonally to one another; and
    said trench cells are disposed in a rhomboidal configuration at every second crossover point.

10. The cell array according to claim 8, wherein said doping region is disposed in said direction of said bit line in a region between said word line associated with a respective one of said trench cells and an adjacent word line running parallel thereto.

11. The cell array according to claim 10, wherein:
said word lines have insulating encapsulation;
an interconnect is connected to said doping region; and
said interconnect is adjacent said surface and is disposed between said insulating encapsulation of a respective one of said word lines associated with a given trench cell and said insulating encapsulation of an adjacent one of said word lines running parallel thereto.

12. The cell array according to claim 8, wherein:
an interconnect is connected to said doping region; and
said interconnect is adjacent said surface and is to be contact-connected from outside the cell array.

13. The cell array according to claim 1, wherein:
an interconnect is connected to said doping region; and
said interconnect is adjacent said surface and is to be contact-connected from outside the cell array.

14. A trench cell for storing digital information, comprising:
a semiconductor substrate of a first conductivity type, said semiconductor substrate defining a trench hole having:
a lower region;
a surface; and
an upper region with a sidewall section;
a storage capacitor being formed in said semiconductor substrate in said lower region of said trench hole, said storage capacitor having an inner electrode, a dielectric intermediate layer, and an outer electrode;
a vertical selection transistor being formed in said semiconductor substrate in said upper region of said trench hole at said sidewall section, said vertical selection transistor having:
an upper source/drain doping region and a lower source/drain doping region of a second conductivity type;
a gate electrode;
an insulator layer; and
a channel region being disposed between said upper source/drain doping region and said lower source/drain doping region, said channel region being isolated from said gate electrode by said insulator layer;
a bit line running in a direction perpendicular to said trench hole, said bit line being connected to said upper source/drain doping region;
a word line running perpendicular to said trench hole and transverse with respect to said bit line, said word line being connected to said gate electrode;
said lower source/drain doping region being connected to one of said inner and outer electrodes; and
a doping region of said first conductivity type being adjacent said surface, said doping region being disposed adjacent said sidewall section of the trench hole in said semiconductor substrate opposite said vertical selection transistor viewed in said direction of said bit line.

15. A cell array, comprising:
a multiplicity of regularly disposed trench cells according to claim 14.

16. The cell array according to claim 15, wherein:
said word line is a plurality of word lines;
said bit line is a plurality of bit lines;
said bit lines and said word lines run orthogonally to one another; and
said trench cells are disposed in a rhomboidal configuration at every second crossover point.

17. The cell array according to claim 15, wherein said doping region is disposed in said direction of said bit line in a region between said word line associated with a respective one of said trench cells and an adjacent word line running parallel thereto.

18. The cell array according to claim 17, wherein:
said word lines have insulating encapsulation;
an interconnect is connected to said doping region; and
said interconnect is adjacent said surface and is disposed between said insulating encapsulation of a respective one of said word lines associated with a given trench cell and said insulating encapsulation of an adjacent one of said word lines running parallel thereto.

19. The cell array according to claim 15, wherein:
an interconnect is connected to said doping region; and
said interconnect is adjacent said surface and is to be contact-connected from outside the cell array.

* * * * *